Oct. 4, 1966 B. G. COHEN ETAL 3,276,097

SEMICONDUCTOR DEVICE AND METHOD OF MAKING

Filed Dec. 19, 1963

INVENTORS B. G. COHEN
R. A. LOGAN
BY David P. Kelley
ATTORNEY 3,276,097
Patented Oct. 4, 1966

3,276,097

SEMICONDUCTOR DEVICE AND METHOD OF MAKING

Barry G. Cohen, Berkeley Heights, and Ralph A. Logan, Morristown, N.J., assignors to Bell Telephone Laboratories, Incorporated, New York, N.Y., a corporation of New York Filed Dec. 19, 1963, Ser. No. 331,867
6 Claims. (Cl. 29—25.3)

Figure 1A:
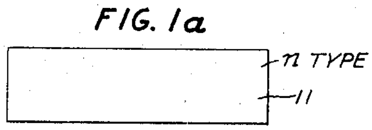

This invention relates to p-n junction devices, and, more particularly, to such devices which exhibit avalanche breakdown and to a method of making such devices.

In a p-n junction diode which is characterized by avalanche breakdown, when a sufficiently large reverse bias is applied, the device breaks down and conducts current in the reverse direction. Once breakdown occurs, the current through the device increases greatly, or exhibits a very steep rise, with little or no increase in reverse-bias voltage. This characteristic is known as avalanche breakdown.

Avalanche breakdown devices, such as p-n junction diodes are useful in a variety of applications, such as, for example, semiconductor photomultiplies, voltage regulators, radiation detectors, and various signal handling or processing arrangements. Heretofore, however, the usefulness of these devices has been, to a large extent, limited because of the presence of microplasmas in the junction. Microplasmas quite often either hamper or prevent the occurrence of normal avalanche breakdown and, instead produce breakdown through the generation of microplasmas of current. These microplasmas of current might be described as minute localized avalanche breakdowns, which materially affect the breakdown characteristics of the device. (They are noisy and occur at reverse voltages, small compared to avalanche voltages.)

Microplasmas are caused by precipitates of impurity atoms at faults in the crystal of the junction device, which may take the form of lattice irregularities, atomic misarrays within the material, stacking faults, or other types of faults which tend to produce disturbances in the crystal lattice. In the manufacturing of these p-n junctions, avalanche breakdown devices, it has, thus far, been extremely difficult to predict the number or degrees of such faults, and hence the number of microplasmas, with the net result that in a single production run, the breakdown characteristics of the devices vary widely. In addition, microplasmas having no multiplication, tend to hide the effects of avalanche breakdown. Naturally, in the quantity production of such devices, it is extremely desirable, if not necessary, to have all of the devices with characteristics which vary within very close tolerance limits, instead of over a wide range.

It is an object, therefore, of the present invention, to produce avalanche breakdown, p-n junction devices having breakdown characteristics which are reproducible within a narrow tolerance range.

Heretofore it has been possible to produce substantially microplasma-free avalanche breakdown devices but the techniques involved are not well understood and are of such complexity and so expensive that they do not lend themselves to quantity production.

Accordingly, it is another object of the present invention to produce substantially microplasma-free avalanche breakdown devices utilizing a method which is readily adaptable to quantity production by virtue of its relative simplicity and low cost.

These and other objects of the present invention are achieved in an illustrative embodiment thereof in which a gallium-arsenide p-n junction diode is fabricated by a process, the principal features of which are as follows. Zinc or cadmium is distilled in an evacuated container and is quenched to condense the metal into a plurality of droplets on the container walls. A droplet of the metal is then placed with a GaAs crystal in a sealed evacuated container with the crystal located at one end above the metal and heated at approximately 1000° C. for cadmium or 800° C. for zinc to diffuse the metal into the crystal. The container is then slowly retracted to a temperature gradient region in the furnace with the crystal at approximately 800° C. and the coolest end of the container at 500° C. for approximately three minutes, and then quenched in air. Pure tin is then evaporated on a lapped surface of the crystal, which is then electroplated with nickel and sintered. The crystal is then electroplated with gold, cut to size, and etched, after which it is mounted and leads bonded thereto.

From the foregoing, it can be seen that the p-n junction device is fabricated by a series of steps that are readily usable in large production runs, and, as will be more apparent hereinafter, precipitation of impurities and thermal and mechanical shock, all of which give rise to microplasmas, have been avoided.

Figure 1B:
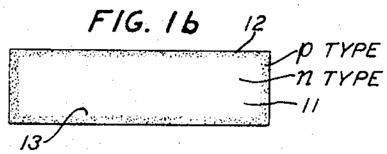
Figure 1C:
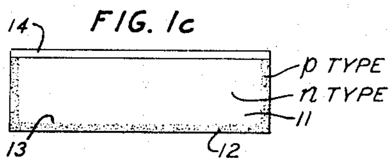
Figure 1D:
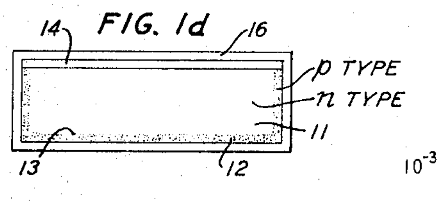
Figure 1E:
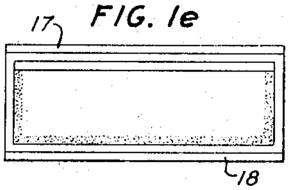
Figure 1F:
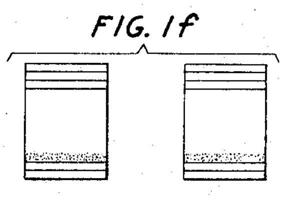
Figure 2:
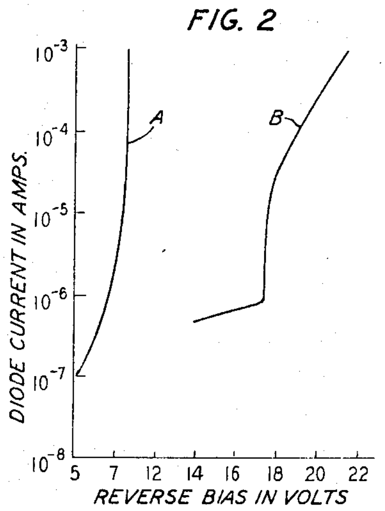

These and other features of the present invention will be more apparent from the following detailed description taken in conjunction with the accompanying drawings, in which:

FIGS. 1*a* through 1*g* depict the various steps in the fabrication of a p-n junction device, and FIG. 2 is a graph of the avalanche breakdown characteristics of a device fabricated by the method of the present invention and a similar device produced by normal methods.

Referring now to the drawings, there is depicted in FIG. 1*a* a wafer 11 of the n-type gallium arsenide having a resistivity of approximately .009–.02 ohm-centimeters and a donor density of approximately $1 \times 10^{17}$ cm.$^{-3}$ that has been lapped and etched to a thickness of, for example, .015 inch and then cleaned and dried.

In order that a microplasma free p-n junction may be formed, a diffusant, which in the present embodiment is zinc or cadmium, is prepared as follows. The metal, which must be of high purity, is prepared by placing a 2 to 10 gram piece in a quartz ampoule that has been thoroughly cleaned and etched and then baked to eliminate all contamination. The ampoule is evacuated to approximately $10^{-6}$ millimeters of mercury or less. It is then baked at a temperature of 300° C. for ten minutes. This process causes the evaporation of a slight amount of the metal which forms a slight metallic deposit toward the cool end of the ampoule. This bake-out process serves to eliminate any impurities or contaminants that may be present in the ampoule. The ampoule is then sealed in a vacuum by pinching at a point between the metal slug and evaporated metal, and is then placed in an oven at 800° C. for ten mintues. It is then quenched by being removed into room air. As a result of the foregoing steps, the metal which was vaporized condenses on the inside of the quartz ampoule in small hemispheres having diameters from less than 1 mil to about 50 mils.

The diffusion process takes place in a quartz ampoule that has been thoroughly cleaned. One satisfactory method of preparing the ampoule is to seal one end and etch in aqua-regia for five minutes and then wash thoroughly with de-ionized water; it is then etched for five minutes in hydrofluoric acid and again washed in de-ionized water. It is then evacuated on a vacuum station to a pressure of less than $10^{-5}$ millimeters of mercury and baked at 1150° C. or higher for thirty minutes.

After the ampoule is prepared, the wafer 11 and a hemisphere of metal of approximately 10 mils diameter are placed in the ampoule which is immediately re-evacuated to a pressure of less than $10^{-5}$ millimeters of mercury and baked at 250° C. for twenty minutes to remove any impurities or contaminants. The ampoule containing the wafer 11 and the metal hemisphere is then sealed under vacuum. The quartz ampoule is then placed in an alumina boat and propped so that the wafer is at one end of the ampoule and higher than the other end which contains the metal hemisphere, and inserted in an oven at a temperature of 800° C. for zinc or 1000° C. for cadmium for thirty minutes. During this period, the metal diffuses into the gallium-arsenide forming a p-type layer 12 covering the wafer 11 as depicted in FIG. 1*b*. After the diffusion has taken place, the ampoule is slowly retracted to a gradient region of the furnace so that the end containing the wafer is maintained at a temperature of 800° C. while the other end is at a temperature below 500° C. The ampoule is left in this gradient region for approximately three minutes and then removed from the furnace and quenched in air to room temperature. In this way, the remaining metal in the ampoule is prevented from condensing on the wafer and alloying thereto. The wafer 11 of n-type material with its over layer 12 of p-type material forming a p-n junction 13 may be left in the ampoule for an indefinite period of time.

From the foregoing description of the process, it is readily apparent that the diffusant metal may be prepared in larger quantities prior to a production run, and that the diffusion process which creates a p-n junction may take place at any time prior to the manufacturing of the actual individual diodes themselves. Thus, it is possible to form a diffusion layer on a large number of n-type wafers and store them in their individual ampoules until they are needed.

The foregoing steps of the process relate to the diffusion of zinc or cadmium into the gallium-arsenside to produce the desired p-n junction. As will be shown later, this junction is substantially microplasma free, and the steps lead to a uniformity and reproducibility of junction characteristics heretofore unobtainable. The following steps of the process relate to the fabricate of the diode itself.

When it is desired to make diodes from the wafer 11, as depicted in FIG. 1*b*, the ampoule containing the wafer is opened and the wafer inspected. That side of the wafer having the more uniform junction is preserved as the p-n junction, and the other side is ground with a fine grit, of material such as silicon carbide, until the junction on that side is removed. In the present example, the wafer is then between 6 and 7 mils thick. After grinding, the surface is lapped and placed in an evaporation chamber with the lapped surface exposed and supported on a clean metal heater strip of, for example, tungsten or tantalum and the chamber is evacuated to a pressure of $10^{-5}$ millimeters of mercury or less. The wafer is then heated to a temperature of 200° C.–210° C. for approximately ten minutes and then pure tin is evaporated onto the lapped surface to a thickness of from 3000–6000 Angstroms. After the evaporation of the tin, the heat is shut off and the wafer cooled to room temperature before it is removed from the vacuum. In FIG. 1*c*, the wafer, with its layer 14 of tin resulting from the foregoing evaporation step, is depicted.

After the wafer is removed from the vacuum chamber, it is placed in an electroless nickel-plating bath, which is maintained at its boiling point and contains sufficient ammonium hydroxide to be a bright blue in color. The wafer is left in the bath for a minimum time of one minute and preferably longer to insure a complete coating on the p-type side of the wafer. After plating, the wafer is removed from the bath and washed in running distilled water. This results in a wafer, as depicted in FIG. 1*d*, which has a coating 16 of nickel on all sides. After being plated, the wafer is placed in the evaporation chamber again with the p-type side up, and the chamber is evacuated to $10^{-5}$ millimeters of mercury or less. The wafer is then sintered at 600° C. for ten minutes, after which it is cooled to room temperature and removed from the chamber. After removal from the chamber the wafer is immediately replaced in the electroless nickel bath and kept there for one minute, after which it is removed and washed in running distilled water.

After the wafer has been nickel plated, it is then gold plated on top and bottom to produce gold layers 17 and 18, as shown in FIG. 1*e*. The gold plating is accomplished by holding the wafer so that one surface just touches the surface of a gold-cyanide-citrate solution. For the n-type side, the wafer is plated for 15 seconds at approximately 10 ma./cm.$^2$ to form a solid dense plate 17 of gold, The p-type side is plated for from two to three seconds at approximately 10 ma./cm.$^2$ to produce a translucent plate 18 of gold.

Figure 1G:
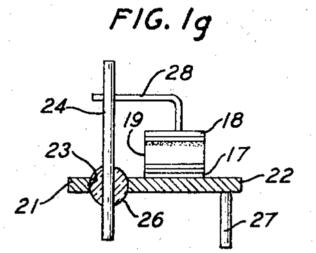

After the gold plating, the wafer is diced to produce a number of individual diodes, as shown in FIG. 1*f*. These diodes may be mounted in any suitable manner known to workers in the art. In FIG. 1*g*, there is shown a diode 19 mounted on a conventional header 21. Header 21 comprises a gold-plated Kovar base 22 having an aperture 23 therein through which passes a Kovar lead 24 that is attached to the base by means of a glass bead 26. A second Kovar lead 27 is attached to base 22 by any suitable means, such as welding. Diode 19 is attached to base 22 by being pressed firmly against base 22 and heated at about 550° C. until gold layer 17 alloys with the gold plating on base 22. Pressure is maintained until the assembly has cooled. The assembly is then etched to achieve a capacitance of from 1.5 to 2.5 mmf, and then washed thoroughly in running distilled water, methyl alcohol, acetone, and then blown dry.

Contact is made to gold layer 18 by a conductive lead 28 that is welded or soldered to lead 24 and is attached to layer 18 by any suitable means, such as soldering, high pressure, or thermocompression bonding.

In FIG. 2, there are depicted graphically the breakdown characteristics for a diode made by the foregoing process, and, for comparison, the characteristics of a diode made by conventional techniques. It can be seen that curve A, which represents the characteristics of microplasma-free junctions made by the foregoing process shows initiation of breakdown at between 5 and 6 volts, with complete breakdown occurring at approximately 7 volts. The curve exhibits almost infinitely increasing current only ½ volt after commencement of breakdown. On the other hand, curve B, which depicts the characteristics of a junction having microplasmas, shows a steep rise in current up to 30$\mu$ amps, but then a considerable increase in voltage at higher currents.

From FIG. 2, it is clear, therefore, that the process of the present invention produces substantially microplasma-free junctions exhibiting infinitely increasing current at constant voltage, i.e., high multiplication, the junction characteristics being reproducible within a narrow tolerance range, while the process itself is relatively simple, and lends itself readily to quantity production.

Devices made in accordance with the present invention exhibit two features which make them exceedingly useful. These are high conductance and low noise, the latter, especially, being due, of course, to the absence of microplasmas. As voltage regulators, such devices will maintain a breakdown voltage independent of current over a much wider current range than devices made by conventional techniques. The breakdown voltage may, of course, be regulated by proper choice of the doping level in the junctions.

As a radiation or particle detector, the junction will amplify any secondary carrier created as a result of the multiplication inherent in the avalanche phenomenon. Because there is no noise, this multiplication can be used to amplify the signal caused by the primary radiation, at speeds or at a frequency response much greater than for a phototransistor. Also note that microplasmas do not show multiplication.

In the foregoing, the invention has been described in terms of GaAs and cadmium or zinc. The application of the principles of the invention to the fabrication of microplasma-free junctions with other materials may readily be apparent to workers in the art without departure from the spirit and scope of the invention.

What is claimed is:

1. The method of making microplasma-free PN junctions in semiconductor material comprising the steps of distilling the diffusant metal in a container and quenching to condense the metal into a plurality of droplets on the container walls, placing a droplet of the diffusant metal and a sample of the semiconductor material into a second container at spaced regions thereof and sealing said container, diffusing said droplet into said sample by heating in a furnace at approximately 800° C. to 1000° C. with the sample located above the droplet, placing the sealed container in a temperature gradient with the sample at approximately 800° C. and the rest of said sealed container below 500° C. for at least three minutes, quenching said sealed container and the sample in air, removing said sample from said sealed container and lapping at least one surface thereof, evaporating pure tin on the lapped surface, electroplating the entire sample with nickel and sintering, electroplating two opposed surfaces of the plated sample with gold so that a gold layer overlays a nickel layer and the tin layer on one surface, and cutting the sample to size and etching the metals until a desired electrical capacitance for the sized sample is obtained.

2. The method as claimed in claim 1 wherein the semiconductor material is gallium-arsenide and the diffusant is zinc.

3. The method as claimed in claim 1 wherein the semiconductor material is gallium-arsenide and the diffusant is cadmium.

4. The method as claimed in claim 1 wherein the semiconductor material is n-type gallium-arsenide having a resistivity of .009–.02 ohm-centimeter and a donor density of approximately $1\times10^{17}$ cm.$^{-3}$.

5. The method of making a PN junction diode having a substantially microplasma-free junction comprising the steps of distilling the diffusant metal in a container and quenching to condense the metal into a plurality of droplets on the container walls, placing a droplet of the diffusant metal and a wafer of semiconductor material in a second container at spaced regions thereof and sealing the container, diffusing the droplet into the wafer by heating in a furnace at approximately 800° C. to 1000° C. for approximately thirty minutes with the wafer located above the droplet, placing the sealed container in a temperature gradient with the wafer at at least 800° C. and the rest of the container below 500° C. for at least one minute, quenching the wafer in air without unsealing the container, removing the wafer from the sealed container and removing the junction on one face of the wafer, evaporating pure tin on said one face of said wafer to a thickness of between 3000–6000 Angstroms, in a vacuum chamber, cooling the wafer to room temperature before removing from the vacuum, electroplating the entire wafer with nickel, washing in distilled water, sintering, and electroplating again for approximately one minute, then washing in distilled water, gold plating the nickel surface overlying the tin plating and the opposite nickel plated surface of the wafer, the n-type side being plated for approximately 15 seconds and the p-type side for from two to three seconds, dicing the wafer to size, mounting a sized die on a header with the n-type side adjacent the head, etching the assembly to achieve a capacitance of from 1.5 to 2.5 mmf., then washing, and mounting a contact to the p-type side of the die.

6. The method as claimed in claim 5 wherein the semiconductor material is n-type gallium-arsenide having a resistivity of .009–.02 ohm-centimeter and a donor density of approximately $1\times10^{17}$ cm.$^{-3}$.

References Cited by the Examiner

UNITED STATES PATENTS

| | | | |
|---|---|---|---|
| 2,900,286 | 8/1959 | Goldstein | 148—1.5 |
| 3,042,550 | 7/1962 | Allen | 117—217 |
| 3,169,304 | 2/1965 | Gould | 29—155.5 |

JOHN F. CAMPBELL, *Primary Examiner.*

WHITMORE A. WILTZ, *Examiner.*

W. I. BROOKS, *Assistant Examiner.*